United States Patent [19]
Brintzinger et al.

[11] Patent Number: 6,060,398
[45] Date of Patent: May 9, 2000

[54] GUARD CELL FOR ETCHING

[75] Inventors: Axel Christoph Brintzinger, Fishkill; Ravikumar Ramachandran; Senthil Kumar Srinivasan, both of Beacon, all of N.Y.

[73] Assignee: Siemens Aktiengesellschaft, Munich, Germany

[21] Appl. No.: 09/037,288

[22] Filed: Mar. 9, 1998

[51] Int. Cl.[7] .................................................. H01L 21/311
[52] U.S. Cl. ........................ 438/696; 438/700; 438/703; 438/735
[58] Field of Search .................................... 438/694, 696, 438/700, 702, 703, 717, 714, 970, 456, 601, 745, 735, 130, 131, 132, 600, 467; 216/41, 51

[56] References Cited

U.S. PATENT DOCUMENTS

| | | | |
|---|---|---|---|
| 5,127,990 | 7/1992 | Pribat et al. | 156/644 |
| 5,538,924 | 7/1996 | Chen | 437/246 |
| 5,690,841 | 11/1997 | Elderstig | 216/39 |
| 5,773,361 | 6/1998 | Cronin et al. | 438/637 |
| 5,899,736 | 5/1999 | Weigand et al. | 438/601 |

OTHER PUBLICATIONS

Wolf, S., Silicon Processing for the VLSI Era, vol. 2—Process Integration, Lattice Press, Sunset Beach, California, 1990, pp. 35–36.

*Primary Examiner*—Benjamin L. Utech
*Assistant Examiner*—Matthew Anderson
*Attorney, Agent, or Firm*—Stanton C. Braden

[57] ABSTRACT

A method and apparatus for protecting a neighboring area that is adjacent to a first area that is to be etched. The method includes creating a guard cell substantially surrounding the first area, but excluding the neighboring area. The guard cell is formed of a material that is substantially selective to the etch process subsequently employed to etch within the first area. After the guard cell is formed, an etch is performed within the first area, while the guard cell prevents etching of the neighboring are outside the guard cell.

19 Claims, 8 Drawing Sheets

GUARD CELL FOR ETCHING

BACKGROUND OF THE INVENTION

The present invention relates to the fabrication of semiconductor devices. More particularly, the present invention relates to the fabrication of a guard cell that advantageously separates and protects one structure of the semiconductor device from other neighboring structures.

As is known in the art, various processes are used in the fabrication of semiconductor devices. Some of these processes, by the nature of the methods used, can have unintentional/undesired affects outside the specific area of fabrication. For example, several fabrication processes use an isotropic etch process. As is known in the art, an isotropic etch process removes material in all directions. Further, it may be difficult to control the depth of the etch performed by such isotropic etch processes. Thus, the etch may extend in a direction or to a depth beyond that needed or useful for the formation of the device to which the isotropic etch is directed.

An example of such a process is found in the fabrication of microcavities. Microcavities and their fabrication are known in the art. They are formed in conjunction with semiconductor devices such as electrically blowable fuses. In a typical electrically blowable fuse, the fuse portion is typically formed of a material that changes its state from conductive to non-conductive when a current exceeding a predefined threshold is passed through. This change in state sometimes produces particulate material. Accordingly, the fuse portion is typically disposed in a dielectric microcavity, i.e., a sealed, hollow chamber in a dielectric layer. Thus, any particulate material that may be formed when fuse portion is blown is kept contained with microcavity, thereby minimizing or essentially eliminating any possibility of particulate contamination of the IC surface. The microcavity itself is typically formed in a multi-step process.

Figure 1A:
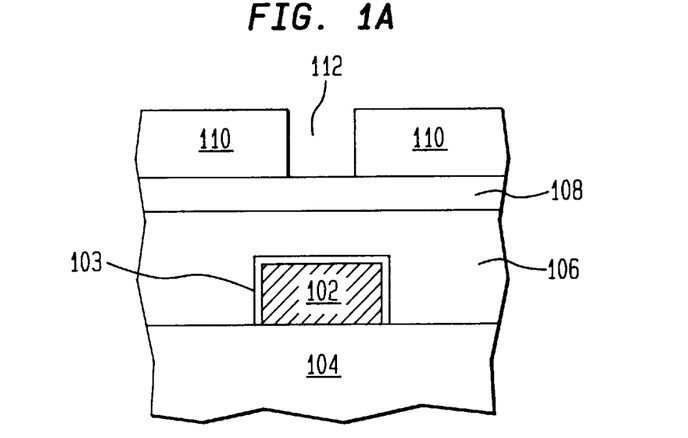
FIG. 1A is a cross-sectional view of a fuse in the process of being fabricated before the formation of a microcavity, in accordance with the prior art.
Figure 1B:
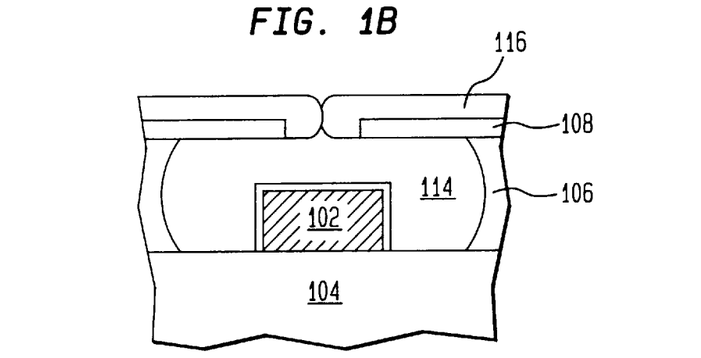
FIG. 1B is a cross-sectional view of the fuse of FIG. 1A after the formation of a microcavity, in accordance with the prior art.
Figure 1C:
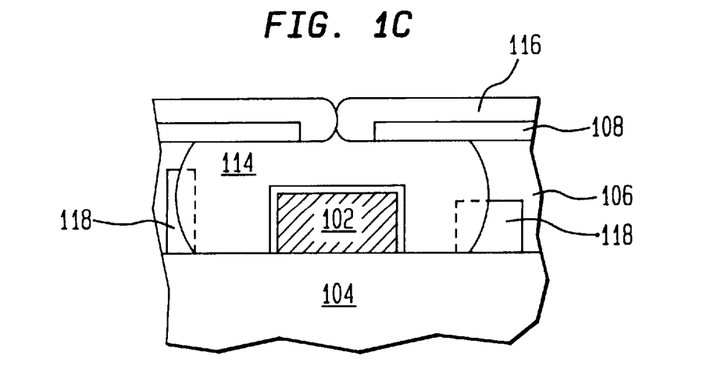
FIG. 1C is a cross-sectional view of the fuse of FIG. 1A after the formation of a microcavity, including neighboring structures which may be damaged if left unprotected.

To facilitate discussion, FIGS. 1A through 1C illustrate a prior art process for forming a microcavity in the context of an electrically blown fuse. Referring initially to FIG. 1A, a fuse portion 102 is shown disposed on a substrate 104. Fuse portion 102 typically comprises a conductor made of a suitable fuse material such as doped polysilicon or metal. The fuse portion is also sometimes capped with a silicon nitride layer 103. Above fuse portion 102, another oxide layer 106 is deposited. A silicon nitride layer 108 is then deposited above oxide layer 106.

Above silicon nitride layer 108, a photoresist layer 110 is deposited and patterned to form an opening 112. Patterned photoresist mask 110 is then employed to etch through silicon nitride layer 108 to expose a portion of oxide layer 106 above fuse portion 102. Although a patterned photoresist mask is shown here, other methods can be used to etch through silicon nitride layer 108 and expose a portion of the oxide layer 106. After an opening in silicon nitride layer 108 is formed, a subsequent isotropic etch is performed to create the microcavity. The microcavity etch preferably employs an etch process that is selective both to the liner material of fuse portion 102 and silicon nitride layer 108. As is apparent, with such a process silicon nitride layer 108 acts as a hard mask during the isotropic etch.

In FIG. 1B, microcavity 114 has been isotropically etched out of oxide layer 106 through the opening in silicon nitride layer 108. Subsequent to the formation of microcavity 114, the opening in silicon nitride layer 108 is sealed with plug material 116 while microcavity 114 is left hollow, thereby sealing fuse portion 102 within microcavity 114.

Due to the isotropic nature of the process, the degree to which the etch extends into oxide layer 106 is difficult to control. Thus, without taking steps to ensure otherwise, structures 118 which neighbor the fuse may be affected by the etch, as depicted in FIG. 1C, possibly resulting in the neighboring structures being damaged or made inoperative. To avoid such damage, the process may include accurately timing and halting the etch duration. This requires close monitoring of the etch process and is subject to error. Also, neighboring structures typically are located a distance from the fuse determined to be sufficient to avoid affecting those structures with the etch. Such distances may be determined from, among other factors, the characteristic interactions of the etch process and material being etched, such as the etch rate. Spacings used must be large enough to take into account the unpredictability of the process and possible errors in efforts to control the process. The requirement of such conservative spacings effectively limit the density with which devices can be formed on the IC, thereby limiting the number of devices that can be included on the IC.

In view of the foregoing, there are desired improved methods for forming microcavities in integrated circuits, which advantageously reduce required distances between semiconductor devices within the microcavity and neighboring devices, facilitating higher density IC's.

SUMMARY OF THE INVENTION

The invention relates, in one embodiment, to a method for protecting neighboring area that is adjacent to a first area to be etched on a substrate. The method includes creating a well substantially surrounding the first area, the neighboring area being disposed outside the well. The method also includes filling the well with a material that is substantially selective to an etch that is subsequently employed to etch the first area, thereby forming a guard cell. There is further included subsequently performing the etch within the first area, the guard cell preventing the etch from etching the neighboring area outside the guard cell.

In another embodiment, the invention relates to an apparatus configured for protecting a neighboring area of a first area from being inadvertently etched by an etch configured to etch in the first area. The apparatus includes a guard cell substantially surrounding the first area. The guard cell is formed of a guard cell material that is substantially selective to the etch, thereby preventing the etch from etching outside the first area that is bounded by the guard cell.

In yet another embodiment, the invention relates to a method for protecting a first area from an etch process configured to etch a neighboring area that is adjacent to the first area on a substrate. The method includes creating a well substantially surrounding the first area, the neighboring area being disposed outside the well. The method also includes filling the well with a material that is substantially selective to the etch that is subsequently employed to etch the neighboring area, thereby forming a guard cell. There is also included subsequently performing the etch of the neighboring area, the guard cell preventing the etch from etching the first area inside the guard cell.

These and other features of the present invention will be described in more detail below in the detailed description of the invention and in conjunction with the following figures.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The present invention will now be described in detail with reference to a few illustrative embodiments thereof as shown in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

In accordance with an embodiment of the present invention, there is provided an improved method of forming a microcavity in an integrated circuit. The integrated circuit (IC) is, for example, a memory IC such as a random access memory (RAM), a dynamic random access memory (DRAM), or a synchronous DRAM (SDRAM). The integrated circuit may also include other types of circuits such as an application specific IC (ASIC), a merged DRAM-logic circuit (embedded DRAM), or any other logic circuit. Typically, numerous integrated circuits are formed on the wafer in parallel. After processing is finished, the wafer is diced to separate the integrated circuits to individual chips. The chips are then packaged, resulting in a final product that is used in, for example, consumer products such as computer systems, cellular phones, personal digital assistants (PDAs), and other electronic products.

One embodiment of the present invention advantageously provides a guard cell before etching of the microcavity. The guard cell limits the area which is etched to form the microcavity, allowing neighboring structures to be packed more densely without risking damage to the neighboring structures from the microcavity etching process. In this manner, integrated circuits can be formed with higher densities and thus more devices.

Figure 2:
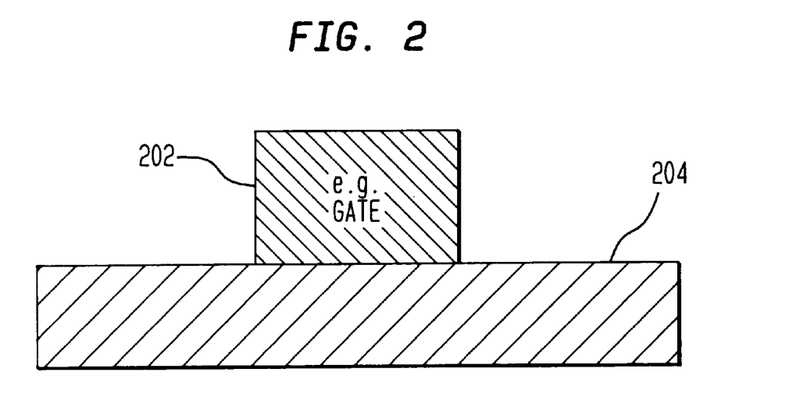
FIG. 2 is a cross-sectional view of a fuse portion of a fuse in the process of being fabricated, in accordance with one embodiment of the present invention.
Figure 3:
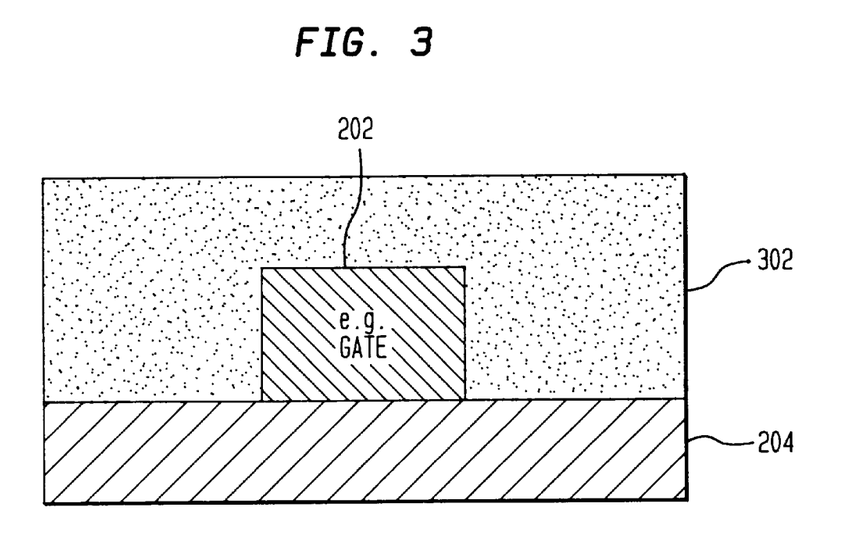
FIG. 3 is a cross-sectional view of 2, with a layer of oxide overlying the fuse portion, in accordance with one embodiment of the present invention.

To facilitate discussion of the features and advantages of the present invention, FIG. 2 illustrates a cross-sectional view of a fuse portion 202 formed above a substrate of the integrated circuit. Although a semiconductor fuse is illustrated in this and following figures, it should be understood that the present invention can be used in conjunction with any type of device. A substrate 204 or portions thereof may be formed of various materials used in the fabrication of the integrated circuit, for example silicon or an oxide layer overlying silicon. Likewise, a fuse portion 202 may be formed of any suitable fuse material known in the art, for example polysilicon, tungsten silicide, copper, or tungsten. FIG. 3 further illustrates the formation of a dielectric layer 302 over fuse portion 202 and substrate 204. Dielectric layer 302 may be formed of any suitable dielectric material, such as an oxide, combination of oxides, borophosphosilicate glass, or tetraethylorthosilicate (TEOS).

Figure 4:
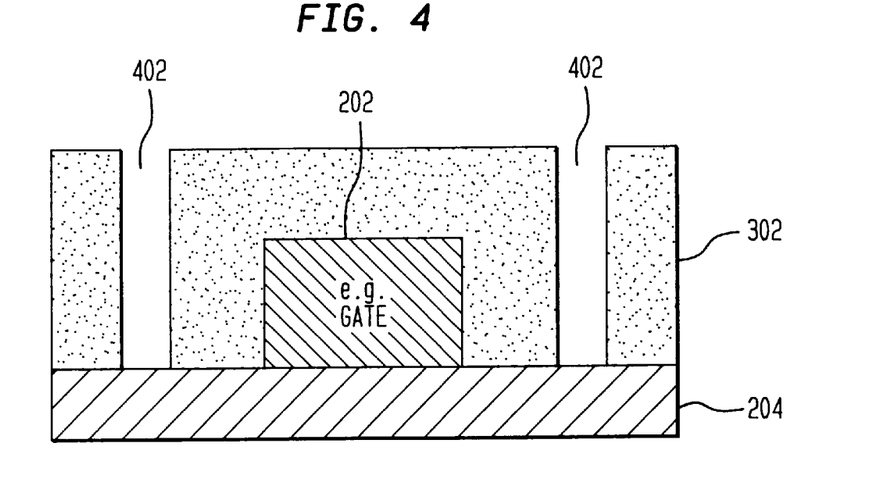
FIG. 4 is a cross-sectional view of the fuse portion of FIG. 3 guard cell well formed in the oxide layer, in accordance with one embodiment of the present invention.
Figure 5:
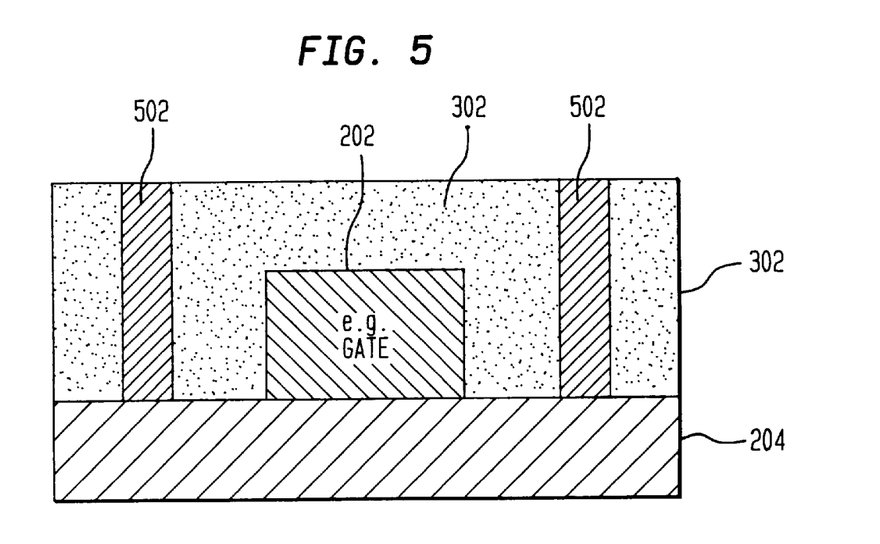
FIG. 5 is a cross-sectional view of the fuse portion of FIG. 4, with the guard cell wells filled, in accordance with one embodiment of the present invention.

As shown in FIG. 4, in accordance with one embodiment of the present invention, a well 402 is formed in dielectric layer 302 around fuse portion 202. Well 402 can be formed by any suitable process known to those who are skilled in the art such as an anisotropic dry etch. Further, well 402 preferably extends from the surface of dielectric layer 302 to the surface of substrate 204. As will be discussed in greater detail with reference to FIGS. 8, in the areas of well 402 that are closest to fuse portion 202 (not shown), well 402 preferably extends from the surface of dielectric layer 302 to the surface of the gate (not shown) extending from fuse portion 202. In addition, well 402 is located some distance from fuse portion 202. The distance between fuse portion 202 and well 402 is determined, in part, by the desired size of the microcavity and the density requirement of the IC. For example, the distance between the well and the side of fuse portion 202 may be less than 2 microns. After the formation of well 402, well 402 is filled to form a guard cell 502. Guard cell 502, shown in FIG. 5, may be formed with any suitable material that is substantially selective to the subsequent etch used to form a microcavity around fuse portion 202 That is, the material of guard cell 502 is preferably a material that does not allow the thickness of guard cell 502 to be etched through during the subsequent etch process employed to form the microcavity. The selection of the appropriate material depends, in part, on the nature of the subsequent microcavity etch process as well as the thickness of the guard cell layer (which depends, in part, on the design rules employed). Note that it is not necessary that the material of guard cell 502 be absolutely unetched during this subsequent etch process. By way of example, materials such as silicon nitride, tungsten, or polysilicon may be employed for guard cell 502.

Figure 6:
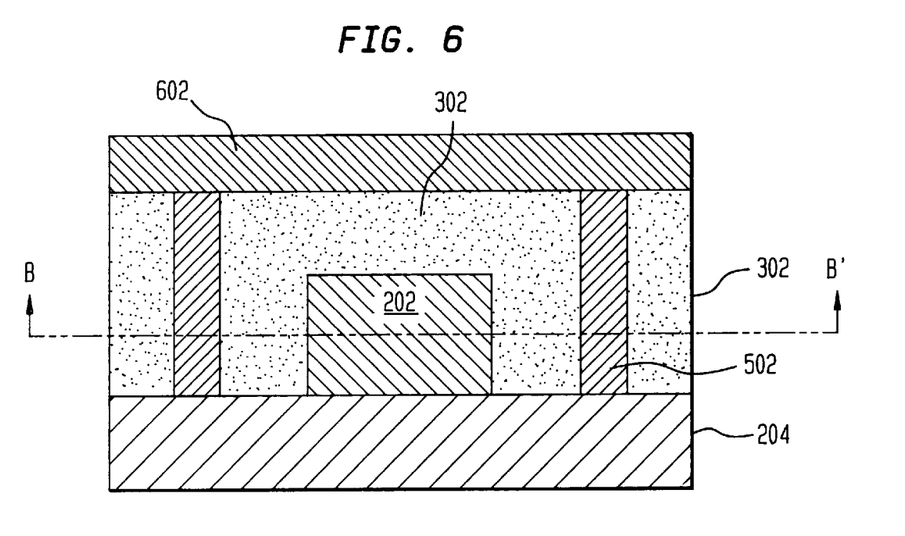
FIG. 6 is a cross-sectional view of the fuse portion of FIG. 5, with a hard mask layer overlying the oxide layer and guard cell, in accordance with one embodiment of the present invention.

FIG. 6 illustrates the process continuing with the formation of a capping layer 602 overlying dielectric layer 302 and guard cell 502. Layer 602 may be formed of any suitable material that is substantially selective to the etch process subsequently used for the formation of the microcavity surrounding fuse portion 202. That is, the material of capping layer 602 is preferably a material that does not allow the thickness of capping layer 602 to be etched through during the subsequent etch process employed to form the microcavity. The selection of the appropriate material depends, in part, on the nature of the subsequent microcavity etch process as well as the thickness of capping layer 602 (which depends, in part, on the design rules employed). Note that it is not necessary that the material of capping layer 602 be absolutely unetched during this subsequent etch process. By way of example, materials such as silicon nitride, tungsten, or polysilicon may be employed for capping layer 602.

Figure 7A:
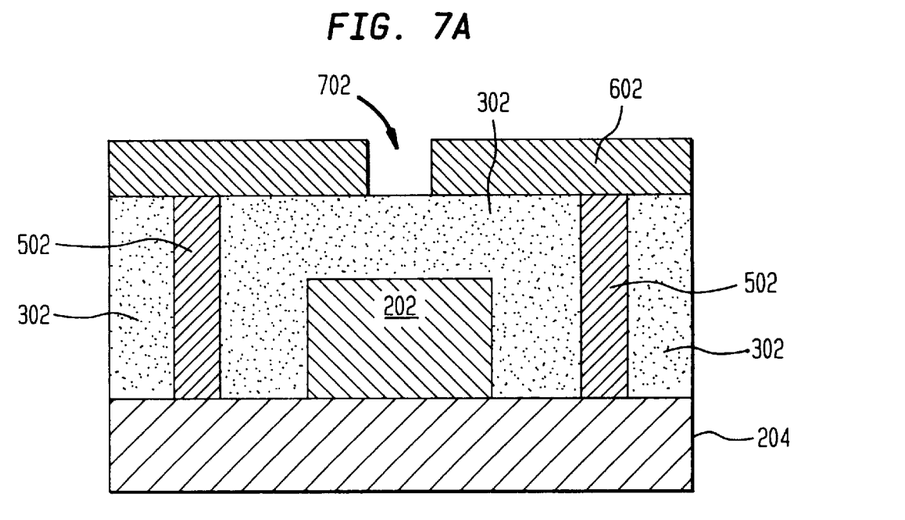
FIG. 7A is a cross-sectional view of the fuse of FIG. 6, with an access hole to facilitate isotropic etch, in accordance with one embodiment of the present invention.
Figure 7B:
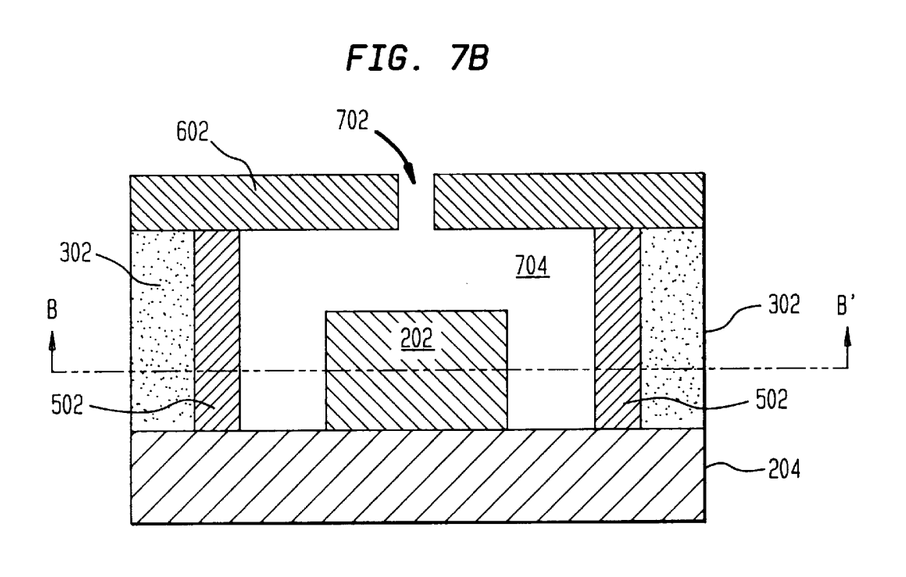
FIG. 7B is a cross-sectional view of the fuse of FIG. 7A with a microcavity, in accordance with one embodiment of the present invention.
Figure 7C:
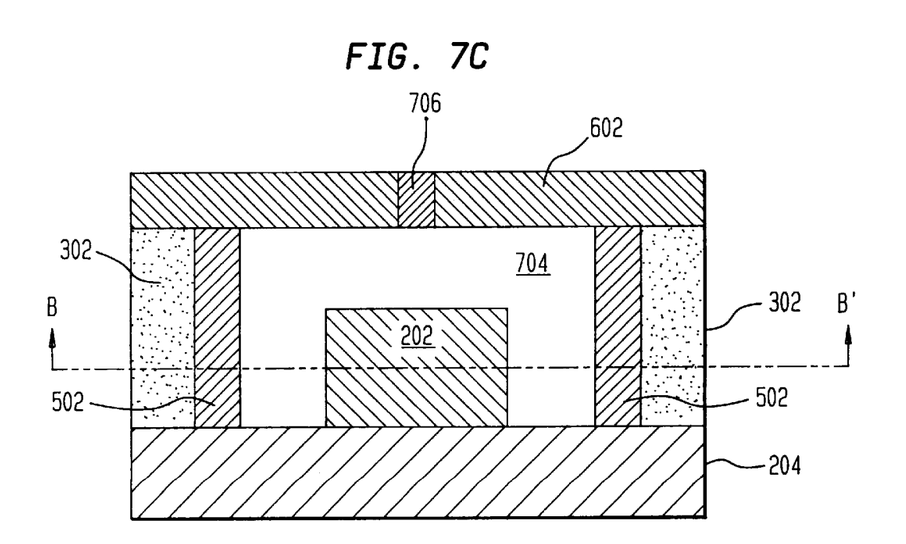
FIG. 7C is a cross-sectional view of the fuse of FIG. 7B with the access hole filled, in accordance with one embodiment of the present invention.

An access hole 702, as shown in FIG. 7A, is formed in layer 602 within the boundaries of guard cell 502. Access hole 702 may be formed through layer 602 by any suitable method known to those skilled in the art, such as applying a mask over layer 602 and performing a wet or dry etch using that mask. FIG. 7B depicts the result of an isotropic etch performed through access hole 702 to form microcavity 704 within guard cell 502 and around fuse portion 202. The etch process used to form microcavity 704 may be any isotropic etch selective to the materials used to form substrate 204, fuse portion 202, guard cell 502 and layer 602. By way of example, if SiO$_2$, silicon nitride, polysilicon, and tungsten are used for the above elements, respectively, an isotropic or wet etch in the form of buffered HF could be used. Although FIG. 7B shows all of the material of layer 302 that was within the boundaries of guard cell 502 to have been removed, it should be understood that the fuse can also be formed without removing all of the material within guard cell 502. However, the presence of guard cell 502 prevents the etching of material outside guard cell 502, including material of dielectric layer 302. As shown in FIG. 7C, plug material 706 is used to fill access hole 702 to enclosed microcavity 704. Any process and material known to those skilled in the art may be used to plug access hole 702 without substantially extending into microcavity 704. By way of example, access hole 702 may be plugged by a plasma TEOS deposition process.

Figure 8A:
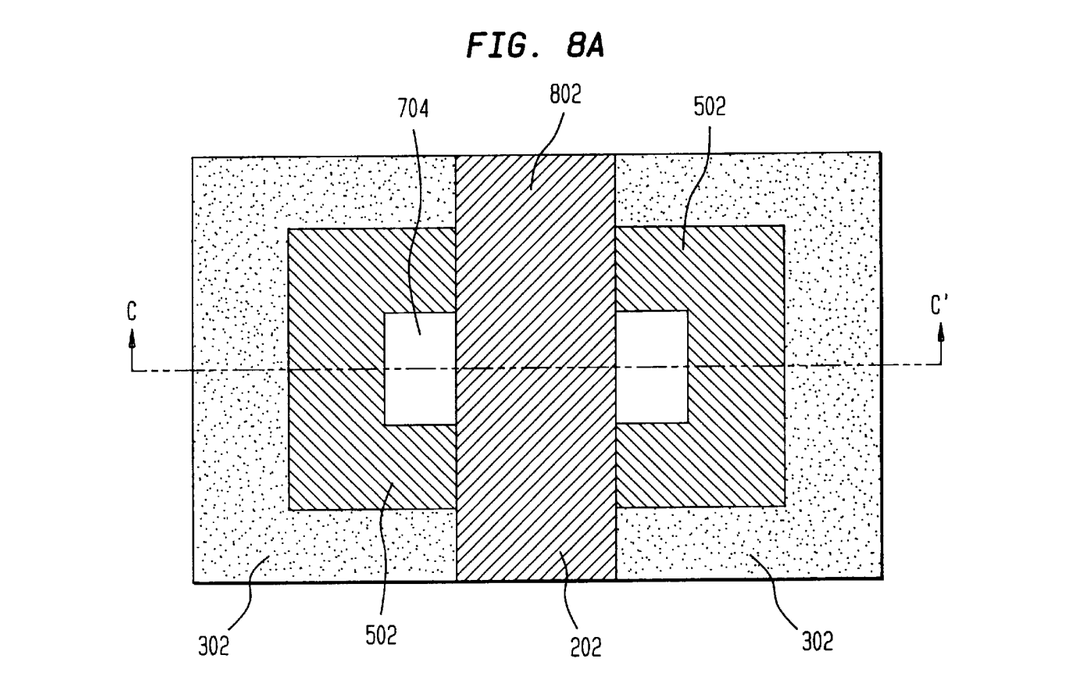
FIG. 8A is a top-down cross-sectional view of the fuse of FIG. 7C across the plane represented in FIG. 7C by line B–B', in accordance with one embodiment of the present invention.

FIG. 8A further illustrates the embodiment of the present invention shown in FIG. 7C, from a top-down view of a cross-section taken along the line B–B' of FIG. 7C. Correspondingly, FIGS. 7A through 7C are front views of the cross-section taken along the line C–C' shown in FIG. 8A. As FIG. 8A shows, guard cell 502 substantially surrounds fuse portion 202, which is a portion of a gate 802. Thus, guard cell 502 creates a physical boundary between microcavity 704 that is around fuse portion 202, and the remaining portions of dielectric layer 302.

Figure 8B:
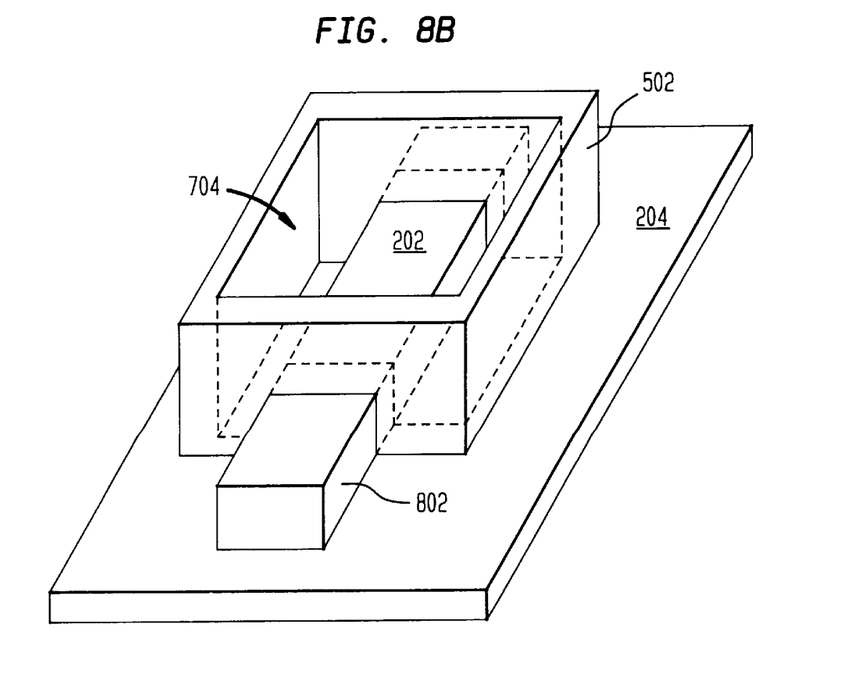
FIG. 8B is a perspective view of the fuse of FIG. 7C, in accordance with one embodiment of the present invention.

The manner in which guard cell 502 substantially surrounds fuse portion 202 can be further understood with reference to FIG. 8B. FIG. 8B depicts guard cell 502, gate 802 including fuse portion 202, and microcavity 704 overlying substrate 204. Remaining dielectric layer 302 (not shown) lies outside guard cell 502, while other layers (not shown) overlie each of the above named elements. Because fuse portion 202 is a portion of gate 802, and microcavity 704 is desired only around fuse portion 202, gate 802 extends beyond fuse portion 202 through, essentially, guard cell 502. Thus, in the formation of well 402, the etch is performed substantially to the surface of gate 802 in those areas where gate 802 extends through guard cell 502. One result of forming guard cell 502 is that fuse portion 202 is substantially surrounded by microcavity 704, and microcavity 704 is substantially physically isolated from the remaining dielectric layer 302. Accordingly, neighboring devices can be positioned as close to guard cell 502 as desired, without risking damage to the neighboring devices, and without requiring a high level of monitoring the microcavity etch process. Thus, the devices on the IC can be more densely packed.

Figure 7D:
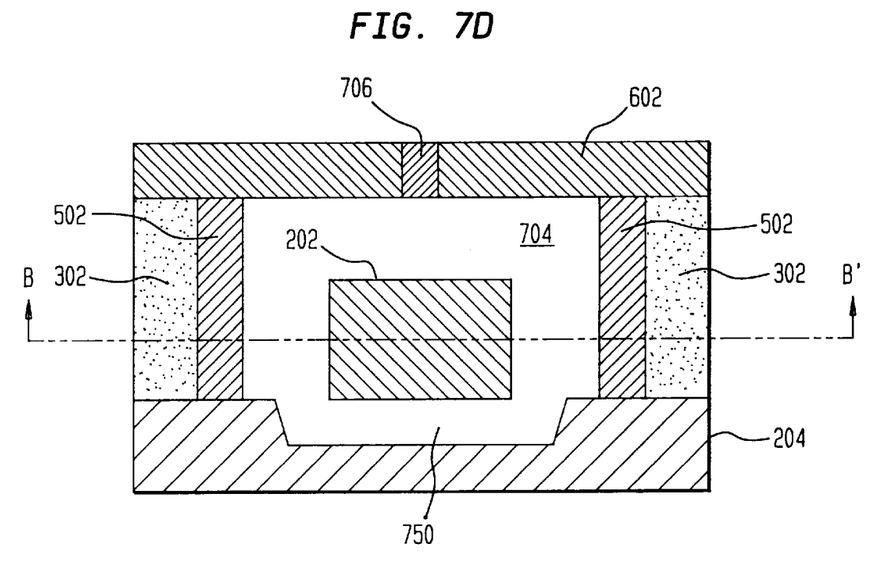
FIG. 7D is a cross-sectional view of an alternative embodiment of the guard cell structure, in accordance with one embodiment of the present invention.
Figure 7E:
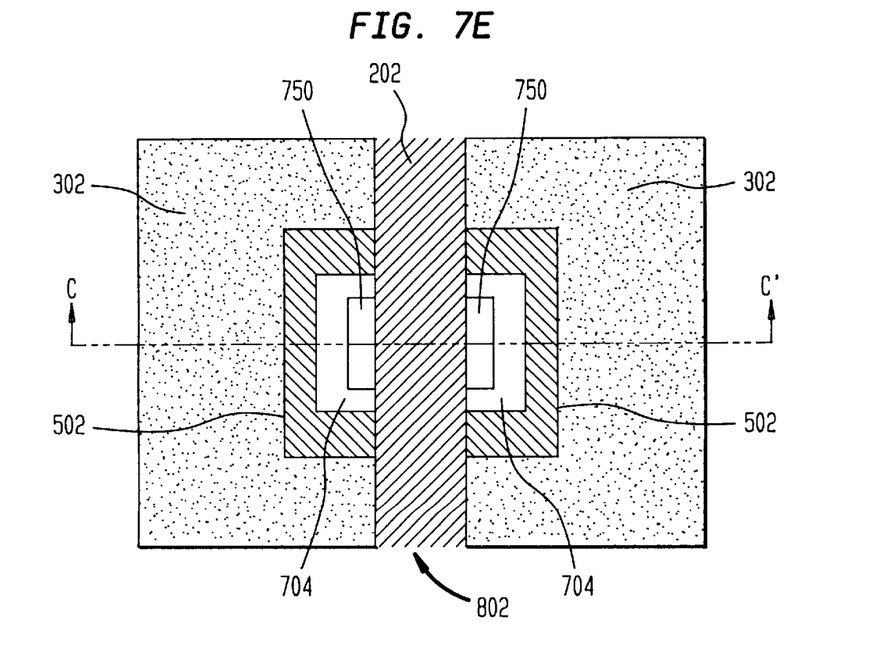
FIG. 7E is a top-down cross sectional view of the guard cell of FIG. 7D across the plane represented in FIG. 7D by line B–B', in accordance with one embodiment of the present invention.

In an alternative embodiment, a material that is not selective to the isotropic etch process used to formed microcavity 704 may be disposed between fuse portion 202 and substrate 204. FIG. 7D shows this embodiment wherein a depression or trench 750 is formed in substrate 204 prior to the deposition of dielectric material 302. In this manner, dielectric material 302 is present above and below fuse portion 202. During the isotropic etch process, this dielectric material is removed from both above and below fuse portion 202, thereby forming a cavity or void not only above but also below the fuse portion itself. FIG. 7E is a top view illustration of this embodiment after isotropic etching is completed. Of course, it should be recognized that the cavity may be formed only below fuse portion 202 if desired by depositing the dielectric material to be etched only below fuse portion 202. It should also be recognized that the cavity may be formed on only one side or both sides (with or without cavities above and/or below the fuse portion) of fuse portion 202 by depositing the dielectric material only in the region where formation of the cavity is desired. Again, it should also be emphasized that although fuse portion 202 is shown herein for ease of discussion, any structure may be protected by the guard cell of the present invention.

Figure 9:
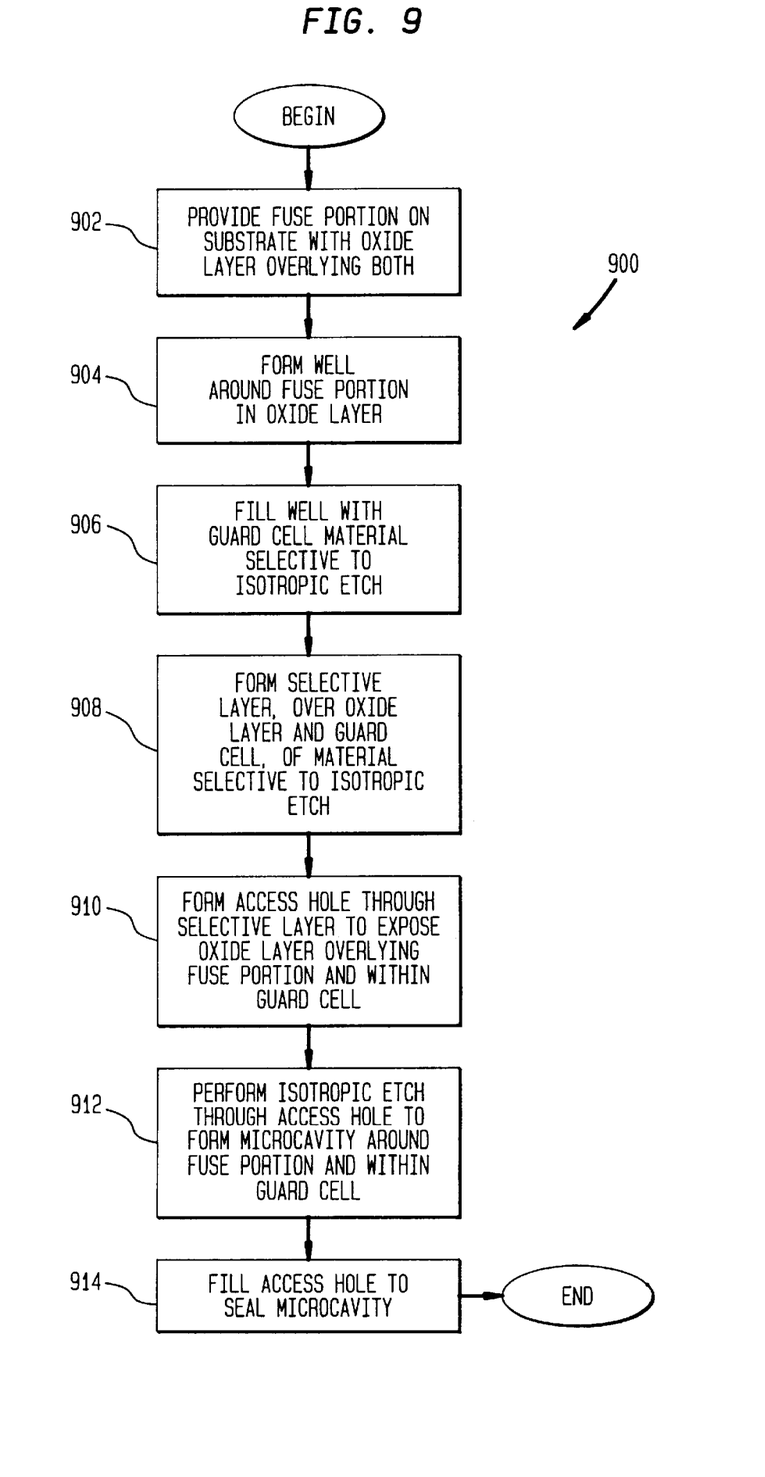
FIG. 9 is a flow chart of a method of forming a fuse in accordance with one embodiment of the present invention.

The process 900 used to form a fuse according to an embodiment of the present invention, is depicted in the flow chart of FIG. 9. In step 902, a fuse portion is provided on a substrate with an oxide layer overlying both the fuse portion and substrate. Subsequently, a well is formed in the oxide layer in step 904, such that the well is around the fuse portion. The well formed in step 904 is then filled with guard cell material in step 906 to form a guard cell substantially surrounding the fuse portion. The guard cell material is any suitable material that is selective to an isotropic etch that will be performed subsequently in process 900. Following the formation of the guard cell in step 904 and 906, a selective layer is formed in step 908 over the oxide layer and the guard cell of material that is also selected to the isotropic etch performed subsequently in process 900. In step 910 an access hole is formed through the selective layer to expose the portion of the oxide layer that overlies the fused portion and lies within the guard cell boundaries. Through the access hole formed in 910 an isotropic etch is performed to form the microcavity around the fused portion and within the guard cell in step 912. After the microcavity is formed, the access hole in the selective layer is filled in step 914, thereby sealing the microcavity formed in step 912.

While this invention has been described in terms of several illustrative embodiments, there are alterations, permutations, and equivalents which fall within the scope of this invention. By way of example, although the guard cell may be employed to protect neighboring areas and neighboring devices from the isotropic etch process employed to form the cavity within the guard cell, it is also possible to employ the guard cell to protect the area and/or devices within the guard cell while etching takes place outside the guard cell. For example, instead of forming access hole 702 (of FIG. 7A) in layer 602, an etch process may be employed to remove portions of layer 602 outside of guard cell 502. In this manner, the area within the guard cell would be protected from any subsequent etch process that is substantially selective to the materials of capping layer 602 and of guard cell 502. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for protecting neighboring area that is adjacent to a first area to be etched on a substrate, the method comprising:

creating a well substantially surrounding the first area, the neighboring area being disposed outside said well;

filling said well with a material that is substantially selective to an etch that is subsequently employed to etch said first area, thereby forming a guard cell; and subsequently performing the etch within said first area, said guard cell preventing said etch from etching said neighboring area outside said guard cell.

2. The method of claim 1, further comprising:

forming a capping layer overlying said first area and said guard cell, said capping layer being formed of a material substantially selective to said etch; and forming a hole through said layer such that a portion of said first area underlying said hole is exposed through said hole.

3. The method of claim 1, wherein said etch is an isotropic which consists of a wet etch or dry etch.

4. The method of claim 1, further comprising:

forming a layer overlying said substrate, said well being created in said layer, said layer being formed of a material that is etchable by said etch that is subsequently employed to etch said first area.

5. The method of claim 4, wherein said layer overlying the substrate is a dielectric layer, said first area further includes therein a gate overlying said substrate, said gate having a fuse portion, and said dielectric layer overlies said substrate and said gate, said guard cell substantially surrounding said fuse portion.

6. The method of claim 5 used in fabricating an integrated circuit.

7. The method of claim 6 wherein the integrated circuit is used in an electronic product.

8. A method for protecting neighboring semiconductor devices that are adjacent to a first area to be isotropically etched on a semiconductor substrate, the method comprising:

creating a guard cell substantially surrounding said first area, said neighboring devices being disposed outside said guard cell, said guard cell being formed from a guard cell material that is selective to an isotropic etch that is employed to etch said first area; and subsequently performing an isotropic etch within said first area, said guard cell preventing said isotropic etch from etching said neighboring devices outside said guard cell.

9. The method of claim 8, wherein creating said guard cell further comprises:

forming a dielectric layer overlying said substrate;

forming a well in said dielectric layer, said well substantially surrounding the first area; and filling said well with said guard cell material.

10. The method of claim 8, further comprising:

forming a gate overlying said substrate, the gate including a fuse portion, said guard cell being formed substantially surrounding said fuse portion.

11. The method of claim 8, further comprising forming a gate overlying said substrate, said gate including a fuse portion, said guard cell being formed substantially surrounding said fuse portion, said dielectric material being disposed above and below said gate.

12. The method of claim 8, wherein said guard cell material is selected from the group consisting essentially of tungsten, polysilicon, and silicon nitride, said isotropic etch is a buffered HF wet etch.

13. A method for creating a fuse in an integrated circuit having a substrate and a gate overlying the substrate, the method comprising:

forming a guard cell, said guard cell substantially surrounding a portion of said gate;

forming a capping layer overlying said gate and said guard cell, said capping layer being formed from material that is substantially selective to an isotropic etch employed to subsequently etch a microcavity inside said guard cell;

creating an access hole through said capping layer above said area around said gate that is bounded by said guard cell; and etching said microcavity around said gate and within said area bounded by said guard cell with said isotropic etch.

14. The method of claim 13, whereby said guard cell is not etched completely through by said isotropic etch.

15. The method of claim 13, wherein said forming of the guard cell further comprises:

forming a well near said gate such that said well substantially surrounds said portion of said gate; and filling said well with a material that is selective to said isotropic etch such that said isotropic etch does not etch through said material during the etching of the microcavity.

16. The method of claim 15, further comprising:

plugging said access hole thereby forming an enclosed cavity around said portion of said gate.

17. The method of claim 15 further comprising:

forming a dielectric layer overlying said gate; and wherein said well is formed by etching said dielectric layer.

18. A method for protecting a first area from an etch process configured to etch a neighboring area that is adjacent to said first area on a substrate, said method comprising:

creating a well substantially surrounding said first area, said neighboring area being disposed outside said well;

filling said well with a material that is substantially selective to said etch that is subsequently employed to etch said neighboring area, thereby forming a guard cell; and subsequently performing said etch of said neighboring area, said guard cell preventing said etch from etching said first area inside said guard cell.

19. The method of claim 18, further comprising:

forming a capping layer overlying said first area and said guard cell, said capping layer being formed of a material substantially selective to said etch.

* * * * *